(12) United States Patent
Ishizawa et al.

(10) Patent No.: US 9,928,934 B2
(45) Date of Patent: Mar. 27, 2018

(54) CURABLE COMPOSITION FOR ELECTRONIC COMPONENT AND CONNECTION STRUCTURE

(71) Applicant: SEKISUI CHEMICAL CO., LTD., Osaka, Osaka (JP)

(72) Inventors: Hideaki Ishizawa, Osaka (JP); Takashi Kubota, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 14/758,220

(22) PCT Filed: Jan. 16, 2014

(86) PCT No.: PCT/JP2014/050615
§ 371 (c)(1),
(2) Date: Jun. 26, 2015

(87) PCT Pub. No.: WO2014/112540
PCT Pub. Date: Jul. 24, 2014

(65) Prior Publication Data
US 2015/0340120 A1    Nov. 26, 2015

(30) Foreign Application Priority Data
Jan. 17, 2013    (JP) ................. 2013-006582

(51) Int. Cl.
| | |
|---|---|
| B32B 27/38 | (2006.01) |
| B32B 27/26 | (2006.01) |
| B32B 27/20 | (2006.01) |
| B32B 27/18 | (2006.01) |
| C08L 63/00 | (2006.01) |
| C09J 163/00 | (2006.01) |

(Continued)

(52) U.S. Cl.
CPC ............... H01B 1/22 (2013.01); C08G 59/40 (2013.01); C08K 5/17 (2013.01); C09J 9/02 (2013.01); H05K 1/11 (2013.01); H05K 2201/023 (2013.01)

(58) Field of Classification Search
None
See application file for complete search history.

(56) References Cited

U.S. PATENT DOCUMENTS

| | | | | |
|---|---|---|---|---|
| 5,417,771 A | * | 5/1995 | Arita | ................. B23K 35/3612 148/23 |
| 2010/0007033 A1 | * | 1/2010 | Kitae | ................... H05K 3/3436 257/778 |
| 2013/0000964 A1 | | 1/2013 | Kobayashi et al. | |

FOREIGN PATENT DOCUMENTS

| | | | | |
|---|---|---|---|---|
| CN | 101939379 A | | 1/2011 | |
| JP | 09-239585 A | * | 9/1997 | ........... B32K 35/363 |

(Continued)

OTHER PUBLICATIONS

Machine translation of JP 09-239585 A (no date).*

(Continued)

*Primary Examiner* — Michael J Feely
(74) *Attorney, Agent, or Firm* — Cheng Law Group, PLLC

(57) ABSTRACT

Provided is a curable composition for an electronic component that can be quickly cured and furthermore can have increased storage stability. The curable composition for an electronic component according to the present invention contains an epoxy compound, an anionic curing agent, a flux, and a basic compound excluding the anionic curing agent.

8 Claims, 2 Drawing Sheets

(51) Int. Cl.
   *H01B 1/22*      (2006.01)
   *C08K 5/17*      (2006.01)
   *H05K 1/11*      (2006.01)
   *C08G 59/40*     (2006.01)
   *C09J 9/02*      (2006.01)

(56) References Cited

FOREIGN PATENT DOCUMENTS

| | | |
|---|---|---|
| JP | 2006-56951 A | 3/2006 |
| JP | 2011-231137 A | 11/2011 |
| JP | 2011-241245 A | 12/2011 |
| JP | 2012-6984 A | 1/2012 |
| JP | 2012-21114 A | 2/2012 |
| JP | 2012-142271 A | 7/2012 |
| JP | 2012-158719 A | 8/2012 |
| JP | 2012-188598 A | 10/2012 |
| JP | 2012-236883 A | 12/2012 |
| WO | WO-2009/123285 A1 | 10/2009 |
| WO | WO-2011/132658 A1 | 10/2011 |

OTHER PUBLICATIONS

Written Opinion of the International Searching Authority (PCT/ISA/237) for Application No. PCT/JP2014,1050615 dated Apr. 22, 2014 (English Translation dated Jul. 30, 2015).
International Search Report for the Application No, PCT/JP2014/050615 dated Apr. 22, 2014.
Written Opinion of the International Searching Authority (PCT/ISA/237) for Application No. PCT/JP2014/050615 dated Apr. 22, 2014.

\* cited by examiner

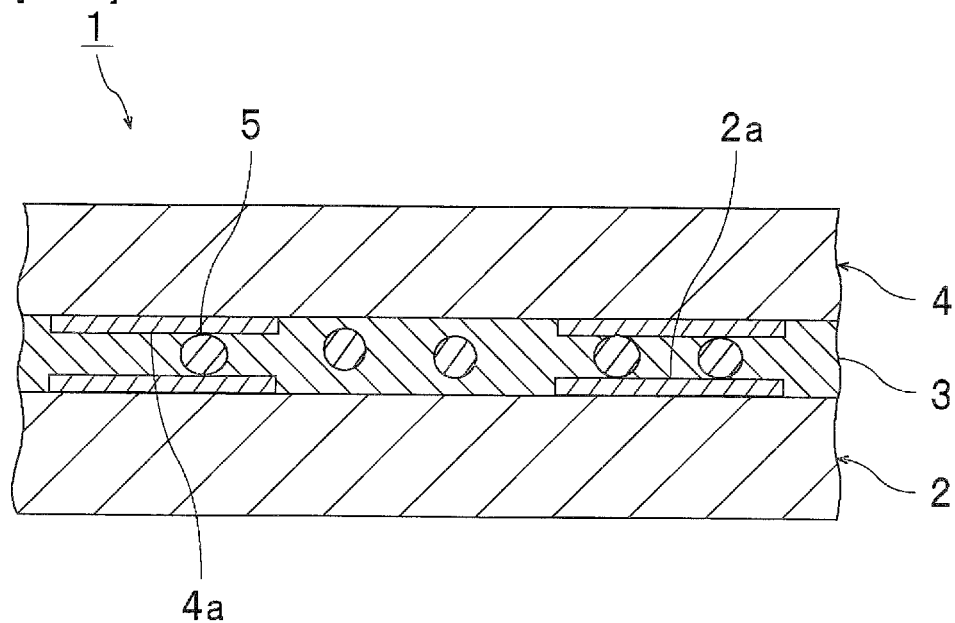
[FIG. 1]
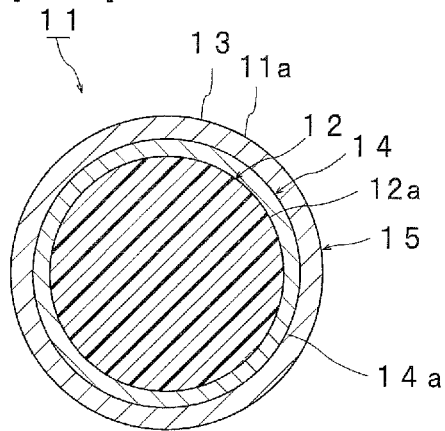
[FIG. 2]

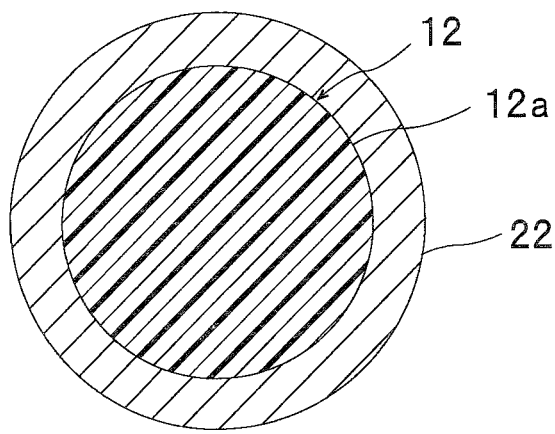
[FIG. 3]
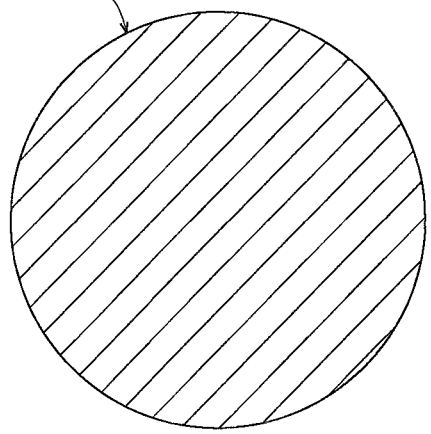
[FIG. 4]

CURABLE COMPOSITION FOR ELECTRONIC COMPONENT AND CONNECTION STRUCTURE

TECHNICAL FIELD

The present invention relates to a curable composition for an electronic component containing an epoxy compound and a curing agent. Also, the present invention relates to a connection structure using the above curable composition for an electronic component.

BACKGROUND ART

An epoxy resin composition has a high adhesive power of a cured product and has a property of being excellent also in moisture resistance and heat resistance of the cured product. For this reason, the epoxy resin composition is widely used for various purposes such as electronics, architecture, and vehicles. Also, in order to connect various connection object members electrically, a conductive particle may be blended in the above epoxy resin composition. An epoxy resin composition containing a conductive particle is referred to as an anisotropic conductive material.

The above anisotropic conductive material is used for connection between an IC chip and a flexible printed circuit board, connection between an IC chip and a circuit board having an ITO electrode, or the like. For example, by heating and pressurizing after disposing an anisotropic conductive material between an electrode of an IC chip and an electrode of a circuit board, these electrodes can be electrically connected by the conductive particle.

As one example of the aforementioned epoxy resin composition, the following Patent Document 1 discloses a composition containing (A) a phenoxy resin, (B) a multifunctional epoxy resin, and (C) an inorganic filler. In Patent Document 1, a flux is raised as an example of an arbitrary component.

The following Patent Document 2 discloses a composition containing an episulfide compound, an amine curing agent, an inclusion imidazole curing agent, a storage stabilizer, and a conductive particle.

The following Patent Document 3 discloses a composition containing a binder resin and a conductive particle having a solder layer. This composition may contain a flux.

RELATED ART DOCUMENT

Patent Document

Patent Document 1: JP 2011-241245 A
Patent Document 1: JP 2012-142271 A
Patent Document 3: WO 2011/132658 A1

SUMMARY OF THE INVENTION

Problems to be Solved by the Invention

In recent years, in order to connect between the electrodes of an electronic component or the like efficiently, it is demanded that the period of time for heating needed for curing the composition is shortened. By shortening the heating time, thermal deterioration of the obtained electronic component can be suppressed.

Patent Document 1 discloses that the generation of voids can be prevented and that the heat conductivity of the cured product can be increased. However, a conventional curable composition such as disclosed in Patent Document 1 may not be thermally cured sufficiently quickly. Also, a conventional curable composition containing a flux may have a low storage stability.

An object of the present invention is to provide a curable composition for an electronic component that can be quickly cured and furthermore can have increased storage stability, as well as a connection structure using the curable composition for an electronic component.

Means for Solving the Problems

According to a wide aspect of the present invention, there is provided a curable composition for an electronic component, containing an epoxy compound, an anionic curing agent, a flux, and a basic compound excluding the anionic curing agent.

In a specific aspect of the curable composition for an electronic component according to the present invention, the basic compound is a primary amine.

In a specific aspect of the curable composition for an electronic component according to the present invention, the basic compound is a primary amine having an aromatic skeleton.

In a specific aspect of the curable composition for an electronic component according to the present invention, the content of the basic compound is 0.1 parts by weight or more and 10 parts by weight or less relative to 100 parts by weight of the epoxy compound.

In a specific aspect of the curable composition for an electronic component according to the present invention, the content of the flux is 0.5 parts by weight or more and 15 parts by weight or less relative to 100 parts by weight of the epoxy compound.

In a specific aspect of the curable composition for an electronic component according to the present invention, the basic compound is benzylamine.

In a specific aspect of the curable composition for an electronic component according to the present invention, the anionic curing agent is an imidazole compound.

In a specific aspect of the curable composition for an electronic component according to the present invention, the curable composition for an electronic component contains a conductive particle.

In a specific aspect of the curable composition for an electronic component according to the present invention, the conductive particle is a conductive particle whose conductive outside surface is a solder.

According to a wide aspect of the present invention, there is provided a connection structure comprising a first connection object member, a second connection object member, and a connection part that connects between the first connection object member and the second connection object member, wherein the connection part is formed by curing a curable composition for an electronic component described above.

In a specific aspect of the connection structure according to the present invention, the curable composition for an electronic component contains a conductive particle; the first connection object member has a first electrode on a surface thereof; the second connection object member has a second electrode on a surface thereof; and the first electrode and the second electrode are electrically connected by the conductive particle.

Effect of the Invention

Because of containing an epoxy compound, an anionic curing agent, a flux, and a basic compound excluding the above anionic curing agent, the curable composition for an electronic component according to the present invention can be quickly cured. Furthermore, storage stability of the composition can be increased.

BRIEF DESCRIPTION OF DRAWINGS

FIG. 1 is a cross-sectional view schematically illustrating a connection structure using a curable composition for an electronic component according to one embodiment of the present invention.

FIG. 2 is a cross-sectional view schematically illustrating a conductive particle that can be used in the curable composition for an electronic component according to one embodiment of the present invention.

FIG. 3 is a cross-sectional view illustrating a variation of the conductive particle.

FIG. 4 is a cross-sectional view illustrating another variation of the conductive particle.

MODE(S) FOR CARRYING OUT THE INVENTION

Hereafter, the details of the present invention will be described.

(Curable Composition for Electronic Component)

A curable composition for an electronic component according to the present invention (which may hereafter be referred to as a curable composition) contains an epoxy compound, an anionic curing agent, a flux, and a basic compound excluding the anionic curing agent. The curable composition is used in an electronic component. The curable composition is suitably used for connection of an electronic component. The curable composition is preferably a connection material for an electronic component. The curable composition is preferably a circuit connection material for an electronic component.

Because of having the composition described above, the curable composition for an electronic component according to the present invention can be quickly cured. Further, because of having the composition described above, the curable composition for an electronic component according to the present invention can increase the storage stability of the curable composition for an electronic component. Further, the moist heat resistance of the cured product can be increased. Also, the heat shock resistance of the cured product can be increased as well.

When a flux is added in a composition containing an epoxy compound and an anionic curing agent, reaction inhibition occurs, and the storage stability of the composition tends to decrease. The present inventors have found out that, even when a flux is added in a composition containing an epoxy compound and an anionic curing agent, the quick curing property and the storage stability of the composition can be sufficiently increased by using a basic compound excluding the above anionic curing agent. In other words, it is important in the present invention that the four components, which are the epoxy compound, the anionic curing agent, the flux, and the basic compound excluding the anionic curing agent, are essentially used in combination.

Hereafter, details of each component contained in the curable composition for an electronic component according to the present invention will be described.

[Epoxy Compound]

The above epoxy compound has an epoxy group. The epoxy compound does not have a radical-polymerizable group. One kind alone of the above epoxy compounds may be used, or two or more kinds thereof may be used in combination.

Examples of the above epoxy compounds include bisphenol type epoxy compounds, phenolnovolac type epoxy compounds, biphenylnovolac type epoxy compounds, biphenol type epoxy compounds, resorcin type epoxy compounds, naphthalene type epoxy compounds, fluorene type epoxy compounds, phenolaralkyl type epoxy compounds, naphtholaralkyl type epoxy compounds, dicyclopentadiene type epoxy compounds, anthracene type epoxy compounds, aniline type epoxy compounds, polyether type epoxy compounds, epoxy compounds having an adamantane skeleton, epoxy compounds having a tricyclodecane skeleton, and epoxy compounds having a triazine nucleus in a skeleton. Examples of the above bisphenol type epoxy compounds include bisphenol-A type epoxy compounds, bisphenol-F type epoxy compounds, and bisphenol-S type epoxy compounds.

The above epoxy compound may have an epoxy group and a radical-polymerizable group. The above radical-polymerizable group means a group that can undergo addition polymerization by a radical. The radical-polymerizable group may be, for example, a group containing an unsaturated double bond or the like. Specific examples of the radical-polymerizable group include an allyl group, an isopropenyl group, a maleoyl group, a styryl group, a vinylbenzyl group, a (meth)acryloyl group, and a vinyl group. Here, the (meth)acryloyl group means an acryloyl group and a methacryloyl group.

From the viewpoint of increasing the quick curing property of the composition and the moist heat resistance of the cured product to a further extent, the radical-polymerizable group preferably has a vinyl group, and is more preferably a (meth)acryloyl group. When the radical-polymerizable group is a (meth)acryloyl group, the radical-polymerizable group has a vinyl group.

From the viewpoint of increasing the quick curing property of the composition to a further extent, the epoxy compound preferably has epoxy groups at both terminal ends. From the viewpoint of increasing the moist heat resistance of the cured product to a further extent, the epoxy compound preferably has a vinyl group in a side chain, and preferably has a (meth)acryloyl group, and preferably has a (meth)acryloyl group in a side chain.

From the viewpoint of increasing the quick curing property of the composition and the moist heat resistance of the cured product to a further extent, the weight-average molecular weight of the epoxy compound is preferably 500 or more, more preferably 1000 or more, and is preferably 150000 or less, more preferably 50000 or less, and still more preferably 15000 or less.

The weight-average molecular weight of the epoxy compound indicates the weight-average molecular weight that is converted in terms of polystyrene as measured by gel permeation chromatography (GPC).

The epoxy compound is more preferably a reaction product using a diol compound and a compound having two epoxy groups. The epoxy compound is preferably obtained by allowing a compound having a vinyl group or a compound having an epoxy group to react with a reaction product of a diol compound and a compound having two epoxy groups.

The epoxy compound preferably has one or more vinyl groups in a side chain, and more preferably has a sum of two or more vinyl groups in a side chain. As the number of vinyl groups increases, the heating time can be shortened to a greater extent, and the adhesion property and the moist heat resistance of the cured product can be increased to a greater extent.

The epoxy compound is preferably a reaction product of a compound having two or more phenolic hydroxyl groups and a compound having two or more epoxy groups.

Examples of the compound having two or more phenolic hydroxyl groups include bisphenol compounds, resorcinol, and naphthalenol. Examples of the bisphenol compounds include bisphenol-F, bisphenol-A, bisphenol-S, bisphenol-SA, and bisphenol-E.

Examples of the epoxy compound having two or more epoxy groups include aliphatic epoxy compounds and aromatic epoxy compounds. Examples of the aliphatic epoxy compounds include compounds having glycidyl ether groups at both terminal ends of an alkyl chain having a carbon number of 3 to 12 and polyether type epoxy compounds having polyether skeletons having a carbon number of 2 to 4 and having a structural unit in which two to ten of the polyether skeletons are continuously bonded.

The epoxy compound is preferably obtained by allowing a compound having a radical-polymerizable group to react with a reaction product (which may hereafter be referred to as reaction product X) of bisphenol-F or resorcinol and 1,6-hexanediol diglycidyl ether or resorcinol diglycidyl ether. In this reaction, the reaction is carried out so that the radical-polymerizable groups may remain. An epoxy compound synthesized by using such a compound can be cured more quickly, and the adhesion property and the moist heat resistance of the cured product can be increased to a greater extent. The compound having a radical-polymerizable group is preferably (meth)acrylic acid or (meth)acryloyloxyethyl isocyanate.

Examples of the reaction product X include a first reaction product of bisphenol-F and 1,6-hexanediol diglycidyl ether, a second reaction product of resorcinol and 1,6-hexanediol diglycidyl ether, a third reaction product of resorcinol and resorcinol diglycidyl ether, and a fourth reaction product of bisphenol-F and resorcinol diglycidyl ether.

The first reaction product has, in a main chain, a structural unit in which a skeleton deriving from bisphenol-F and a skeleton deriving from 1,6-hexanediol diglycidyl ether are bonded, and has, at both terminal ends, epoxy groups deriving from 1,6-hexanediol diglycidyl ether. The second reaction product has, in a main chain, a structural unit deriving from resorcinol and a structural unit deriving from 1,6-hexanediol diglycidyl ether, and has, at both terminal ends, epoxy groups deriving from 1,6-hexanediol diglycidyl ether. The third reaction product has, in a main chain, a skeleton deriving from resorcinol and a skeleton deriving from resorcinol diglycidyl ether, and has, at both terminal ends, epoxy groups deriving from resorcinol diglycidyl ether. The fourth reaction product has, in a main chain, a skeleton deriving from bisphenol-F and a skeleton deriving from resorcinol diglycidyl ether, and has, at both terminal ends, epoxy groups deriving from resorcinol diglycidyl ether.

From the viewpoint of facilitating synthesis, enabling furthermore quicker curing of the epoxy compound, and increasing the adhesion property and the moist heat resistance of the cured product, the first reaction product, the second reaction product, or the third reaction product is preferable among the first, second, third, and fourth reaction products. The reaction product X is preferably the first reaction product, and is also preferably the second reaction product, and further is also preferably the third reaction product.

[Anionic Curing Agent]

As the anionic curing agent, a known anionic curing agent can be used. One kind of the anionic curing agent may be used alone, or two or more kinds thereof may be used in combination.

Examples of the anionic curing agent include imidazole curing agents, amine curing agents such as hydrazide-based, boron trifluoride-amine complex, amineimide, polyamine-based, tertiary amine-based, and alkylurea-based amine curing agents and denatured products thereof, dicyandiamide and denatured products thereof, and polythiol curing agents.

The imidazole curing agent is not particularly limited, and examples thereof include 2-methylimidazole, 2-ethyl-4-methylimidazole, 1-cyanoethyl-2-phenylimidazole, 2-propylimidazole, 2-dodecylimidazole, 2-phenyl-4-methylimidazole, 4-methylimidazole, 1-cyanoethyl-2-phenylimidazolium trimellitate, 2,4-diamino-6-[2'-methylimidazolyl-(1')]-ethyl-s-triazine, and 2,4-diamino-6-[2'-methylimidazolyl-(1')]-ethyl-s-triazine isocyanuric acid adduct.

The amine curing agent is not particularly limited, and examples thereof include hexamethylenediamine, octamethylenediamine, decamethylenediamine, 3,9-bis(3-aminopropyl)-2,4,8,10-tetraspiro[5.5]undecane, bis(4-aminocyclohexyl)methane, metaphenylenediamine, and diaminodiphenylsulfone.

The polythiol curing agent is not particularly limited, and examples thereof include trimethylolpropanetris-3-mercaptopropionate, pentaerythritoltetrakis-3-mercaptopropionate, and dipentaerythritolhexa-3-mercaptopropionate.

From the viewpoint of making an excellent storage stability and an excellent curing property be compatible with each other at a further higher level, it is preferable to use a microcapsule having the anionic curing agent as a core. In the case of an imidazole curing agent, a microcapsule in which the imidazole curing agent is covered with a polymer such as polyurethane or polyester is preferable.

Examples of the microcapsule include Novacure HX3941HP, Novacure HX3921HP, Novacure HX3721, Novacure HX3722, Novacure HX3748, Novacure HX3088, Novacure HX3741, Novacure HX3742, and Novacure HX3613 (manufactured by Asahi Kasei E-materials Co., Ltd.).

From the viewpoint of increasing the quick curing property of the composition to a greater extent and effectively increasing the storage stability by adopting the composition in the present invention, the anionic curing agent is preferably an imidazole compound.

The content of the anionic curing agent is preferably 1 part by weight or more, more preferably 5 parts by weight or more, and preferably 65 parts by weight or less, more preferably 55 parts by weight or less, relative to 100 parts by weight of the epoxy compound. When the content of the anionic curing agent is above or equal to the above lower limit and below or equal to the above upper limit, the quick curing property and the storage stability of the composition increase with a good balance.

[Flux]

As the flux, a known flux can be used. One kind of the flux may be used alone, or two or more kinds thereof may be used in combination.

The flux is not particularly limited. As the flux, a flux generally used in solder bonding or the like can be used. Examples of the flux include zinc chloride, a mixture of zinc chloride and an inorganic halogenide, a mixture of zinc chloride and an inorganic acid, a molten salt, phosphoric acid, a derivative of phosphoric acid, an organic halogenide, hydrazine, an organic acid, and turpentine.

The molten salt may be, for example, ammonium chloride or the like. The organic acid may be, for example, lactic acid, citric acid, stearic acid, glutamic acid, or the like. The turpentine may be, for example, activated turpentine, inactivated turpentine, or the like. The flux is preferably turpentine. By use of turpentine, the connection resistance between the electrodes is reduced to a further extent.

The turpentine is a rosin containing abietic acid as a major component. The flux is preferably a rosin, and is more preferably abietic acid. By use of this preferable flux, the connection resistance between the electrodes is reduced to a further extent. Also, the flux is preferably an organic acid having a carboxyl group. The compound having a carboxyl group may be, for example, a compound in which a carboxyl group is bonded to an alkyl chain, a compound in which a carboxyl group is bonded to an aromatic ring, or the like. In these compounds having a carboxyl group, a hydroxyl group may further be bonded to the alkyl chain or the aromatic ring. The number of carboxyl groups bonded to the alkyl chain or the aromatic ring is preferably 1 to 3, and more preferably 1 or 2. The carbon number of the alkyl chain in the compound in which a carboxyl group is bonded to the alkyl chain is preferably 3 or more and preferably 8 or less, more preferably 6 or less. Specific examples of the compound in which a carboxyl group is bonded to an alkyl chain include hexanoic acid (carbon number of 5, and one carboxyl group), succinic acid (carbon number of 2, and two carboxyl groups), glutaric acid (carbon number of 3, and two carboxyl groups), and adipic acid (carbon number of 4, and two carboxyl groups). Specific examples of the compound having a carboxyl group and a hydroxyl group include malic acid and citric acid. Specific examples of the compound in which a carboxyl group is bonded to an aromatic ring include benzoic acid, phthalic acid, benzoic anhydride, and phthalic anhydride.

The content of the flux is preferably 0.5 parts by weight or more, more preferably 1 part by weight or more, and preferably 15 parts by weight or less, more preferably 10 parts by weight or less, and still more preferably 5 parts by weight or less, relative to 100 parts by weight of the epoxy compound. When the content of the flux is above or equal to the above lower limit and below or equal to the above upper limit, the effect of adding the flux is more effectively exhibited. For this reason, the flux effect in the composition increases, and the electric conductivity between the electrodes, for example, increases to a greater extent.

[Basic Compound]

The basic compound is a basic compound excluding the anionic curing agent. As the basic compound, the aforementioned anionic curing agent is excluded. Because many of the imidazole compounds are anionic curing agents, it is preferred that the basic compound is not an imidazole compound. From the viewpoint of increasing the storage stability of the composition to a greater extent, the basic compound is preferably a basic compound excluding a curing promoting agent, and it is preferred that the basic compound is not a curing promoting agent. One kind of the basic compound may be used alone, or two or more kinds thereof may be used in combination.

From the viewpoint of increasing the quick curing property and the storage stability of the composition to a greater extent, the basic compound preferably has an aromatic skeleton, preferably has an aryl group, preferably has a phenyl group, and is preferably a primary amine. The basic compound is more preferably a primary amine having an aromatic skeleton. By use of a primary amine, the quick curing property and the storage stability of the composition are made better. By use of a primary amine having an aromatic skeleton, the quick curing property and the storage stability of the composition are made further better.

Examples of the primary amine include benzylamine, 2-methylbenzylamine, 3-methylbenzylamine, and 4-tert-butylbenzylamine. Examples of a secondary amine include N-methylbenzylamine, N-ethylbenzylamine, N-phenylbenzylamine, N-tert-butylbenzylamine, and N-isopropylbenzylamine. Examples of a tertiary amine include N,N-dimethylbenzylamine. Among these, from the viewpoint of increasing the storage stability of the composition to a greater extent, 2-methylbenzylamine or benzylamine is preferable, and benzylamine is more preferable.

From the viewpoint of increasing the quick curing property and the storage stability of the composition to a greater extent, it is preferred that the anionic curing agent is an imidazole compound and the basic compound is a primary amine, and it is more preferred that the anionic curing agent is an imidazole compound and the basic compound is a primary amine having an aromatic skeleton.

The content of the basic compound is preferably 0.1 parts by weight or more, more preferably 0.5 parts by weight or more, still more preferably 1 part by weight or more, and preferably 10 parts by weight or less, more preferably 5 parts by weight or less, relative to 100 parts by weight of the epoxy compound. When the content of the basic compound is above or equal to the above lower limit and below or equal to the above upper limit, the quick curing property and the storage stability of the composition increase with a good balance.

The content of the basic compound is such that, when a blended product obtained by blending 1 g of a curable composition and 30 g of pure water is stirred at 2000 rpm for 3 minutes by a planetary stirrer and the pH of the supernatant is measured, the pH is preferably 4.5 or more, more preferably 5 or more, and preferably 6.5 or less, more preferably 5.5 or less.

[Photocurable Compound]

In order to be cured by radiation of light, the curable composition preferably contains a photocurable compound. By radiation of light, the photocurable compound can be semicured (brought into a B-stage), and the fluidity of the curable compound can be reduced. The photocurable compound is preferably a radical-polymerizable compound.

The photocurable compound is not particularly limited and may be, for example, a photocurable compound having a (meth)acryloyl group, a photocurable compound having a cyclic ether group, or the like.

The photocurable compound is preferably a photocurable compound having a (meth)acryloyl group. By use of a photocurable compound having a (meth)acryloyl group, the conduction reliability of the connection structure can be increased to a greater extent. From the viewpoint of effectively increasing the conduction reliability of the obtained connection structure, the photocurable compound preferably has one or two (meth)acryloyl groups.

Examples of the photocurable compound having a (meth) acryloyl group include a photocurable compound that does not have an epoxy group and a thiirane group and has a (meth)acryloyl group and a photocurable compound that has an epoxy group or a thiirane group and has a (meth)acryloyl group.

As the photocurable compound having a (meth)acryloyl group, an ester compound obtained by allowing (meth) acrylic acid and a compound having a hydroxyl group to react with each other, an epoxy (meth)acrylate obtained by allowing (meth)acrylic acid and an epoxy compound to react with each other, a urethane (meth)acrylate obtained by allowing a (meth)acrylic acid derivative having a hydroxyl group to react with isocyanate, or the like can be suitably used. The aforementioned "(meth)acryloyl group" indicates an acryloyl group and a methacryloyl group. The aforementioned "(meth)acryl" indicates acryl and methacryl. The aforementioned "(meth)acrylate" indicates acrylate and methacrylate.

The ester compound obtained by allowing (meth)acrylic acid and a compound having a hydroxyl group to react with each other is not particularly limited. As the ester compound, any of monofunctional ester compounds, bifunctional ester compounds, and trifunctional or more-functional ester compounds can be used.

The photocurable compound that has an epoxy group or a thiirane group and has a (meth)acryloyl group is preferably a photocurable compound obtained by converting apart of the epoxy groups or a part of the thiirane groups of a compound having two or more epoxy groups or two or more thiirane groups into (meth)acryloyl groups. Such a photocurable compound is a partially (meth)acrylated epoxy compound or a partially (meth)acrylated episulfide compound.

The photocurable compound is preferably a reaction product of (meth)acrylic acid with a compound having two or more epoxy groups or two or more thiirane groups. This reaction product is obtained by allowing (meth)acrylic acid and a compound having two or more epoxy groups or two or more thiirane groups to react with each other in the presence of a catalyst according to an ordinary method. It is preferred that 20% or more of the epoxy groups or thiirane groups are converted (conversion rate) into (meth)acryloyl groups. The conversion rate is more preferably 30% or more, and preferably 80% or less, more preferably 70% or less. Most preferably, 40% or more and 60% or less of the epoxy groups or thiirane groups are converted into (meth)acryloyl groups.

Examples of the partially (meth)acrylated epoxy compound include bisphenol type epoxy (meth)acrylate, cresolnovolac type epoxy (meth)acrylate, carboxylic anhydride denatured epoxy (meth)acrylate, and phenolnovolac type epoxy (meth)acrylate.

As the photocurable compound, a denatured phenoxy resin obtained by converting a part of the epoxy groups or a part of the thiirane groups of a phenoxy resin having two or more epoxy groups or two or more thiirane groups into (meth)acryloyl groups may be used. In other words, a denatured phenoxy resin having an epoxy group or a thiirane group and having a (meth)acryloyl group may be used.

Also, the above photocurable compound may be a crosslinking compound or may be a noncrosslinking compound.

Specific examples of the above crosslinking compound include 1,4-butanediol di(meth)acrylate, 1,6-hexanediol di(meth)acrylate, 1,9-nonanediol di(meth)acrylate, (poly)ethylene glycol di(meth)acrylate, (poly)propylene glycol di(meth)acrylate, neopentylglycol di(meth)acrylate, pentaerythritol di(meth)acrylate, glycerin methacrylate acrylate, pentaerythritol tri(meth)acrylate, trimethylolpropane trimethacrylate, allyl (meth)acrylate, vinyl (meth)acrylate, divinylbenzene, polyester (meth)acrylate, and urethane (meth)acrylate.

Specific examples of the above noncrosslinking compound include ethyl (meth)acrylate, n-propyl (meth)acrylate, isopropyl (meth)acrylate, n-butyl (meth)acrylate, isobutyl (meth)acrylate, t-butyl (meth)acrylate, pentyl (meth)acrylate, hexyl (meth)acrylate, heptyl (meth)acrylate, 2-ethylhexyl (meth)acrylate, n-octyl (meth)acrylate, isooctyl (meth)acrylate, nonyl (meth)acrylate, decyl (meth)acrylate, undecyl (meth)acrylate, dodecyl (meth)acrylate, tridecyl (meth)acrylate, and tetradecyl (meth)acrylate.

[Other Components]

The above curable composition may further contain an adhesive power adjusting agent, an inorganic filler, a solvent, a storage stabilizer, an ion scavenger, a silane coupling agent, or the like in accordance with the needs.

(Curable Composition for Electronic Component Containing Conductive Particle)

When the above curable composition contains a conductive particle, the above curable composition can be used as a conductive material. The conductive material is preferably an anisotropic conductive material.

The conductive particle electrically connects between the electrodes of connection object members. Specifically, the conductive particle electrically connects between the electrodes of, for example, a circuit board and a semiconductor chip. The conductive particle is not particularly limited as long as the conductive particle is a particle having an electric conductivity. It is sufficient that the conductive particle has a conductive part at a conductive surface.

The conductive particle may be, for example, a conductive particle in which a surface of an organic particle, an inorganic particle excluding a metal particle, an organic inorganic hybrid particle, a metal particle, or the like is covered with a conductive layer (metal layer), a metal particle substantially constituted of metal alone, or the like.

FIG. 2 shows a cross-sectional view of a conductive particle that can be used in a curable composition for an electronic component according to one embodiment of the present invention.

A conductive particle 11 shown in FIG. 2 has a resin particle 12 (base material particle) and a conductive layer 13 disposed on a surface 12a of the resin particle 12. The conductive layer 13 covers the surface 12a of the resin particle 12. The conductive particle 11 is a covered particle in which the surface 12a of the resin particle 12 is covered with the conductive layer 13. Therefore, the conductive particle 11 has the conductive layer 13 at a surface 11a. A metal particle or the like may be used in place of the resin particle 12.

The conductive layer 13 has a first conductive layer 14 disposed on the surface 12a of the resin particle 12 and a solder layer 15 (solder, second conductive layer) disposed on a surface 14a of the first conductive layer 14. The outside surface layer of the conductive layer 13 is the solder layer 15. Therefore, the conductive particle 11 has the solder layer 15 as part of the conductive layer 13 and further has, between the resin particle 12 and the solder layer 15, the first conductive layer 14 separately from the solder layer 15 as part of the conductive layer 13. In this manner, the conductive layer 13 may have a multilayer structure and may have a lamination structure made of two or more layers.

As described above, the conductive layer 13 has a two-layer structure. As a variation shown in FIG. 3, a conductive particle 21 may have a solder layer 22 as a conductive layer of a single layer. It is sufficient that at least an outside surface layer (surface) of a conductive layer in a conductive particle is a solder layer (solder). However, because of facility in fabricating a conductive particle, the conductive particle 11 is preferable between the conductive particle 11 and the conductive particle 21. Also, as another variation shown in FIG. 4, a conductive particle 31 may be used which is a solder particle that does not have a base material particle as a core and is not a core-shell particle. In the conductive particle 31, the central part also is made of solder.

The conductive particles 11, 21, 31 can be used in the above conductive material.

The conductive part is not particularly limited. Examples of the metal constituting the conductive part include gold, silver, copper, nickel, palladium, and tin. The conductive layer may be, for example, a gold layer, a silver layer, a copper layer, a nickel layer, a palladium layer, or a conductive layer containing tin.

From the viewpoint of increasing the contact area between the electrode and the conductive particle and further increasing the conduction reliability between the electrodes, the conductive particle preferably has a resin particle and a conductive layer (first conductive layer) disposed on a surface of the resin particle. From the viewpoint of further increasing the conduction reliability between the electrodes, the conductive particle is preferably a conductive particle in which at least a conductive outside surface is a low-melting-point metal layer. It is more preferred that the conductive particle has a base material particle and a conductive layer disposed on a surface of the base material particle, and at least an outside surface of the conductive layer is a low-melting-point metal layer. It is more preferred that the conductive particle has a resin particle and a conductive layer disposed on a surface of the resin particle, and at least an outside surface of the conductive layer is a low-melting-point metal layer.

The above low-melting-point metal layer is a layer containing a low-melting-point metal. The low-melting-point metal indicates a metal having a melting point of 450° C. or lower. The melting point of the low-melting-point metal is preferably 300° C. or lower, more preferably 160° C. or lower. Also, the above low-melting-point metal preferably contains tin. In 100 wt % of the metal contained in the low-melting-point metal, the content of tin is preferably 30 wt % or more, more preferably 40 wt % or more, still more preferably 70 wt % or more, and most preferably 90 wt % or more. When the content of tin in the low-melting-point metal is above or equal to the above lower limit, the connection reliability between the low-melting-point metal and the electrode is further increased. Here, the content of tin can be measured by using a high-frequency induction coupling plasma emission spectrometry apparatus ("ICP-AES" manufactured by Horiba, Ltd.), a fluorescence X-ray analyzing apparatus ("EDX-800HS" manufactured by Shimadzu Corporation), or the like. From the viewpoint of further increasing the storage stability of the composition at a comparatively high temperature, the above conductive particle is a conductive particle in which a conductive outside surface is solder.

In the case in which the outside surface of the conductive part is a low-melting-point metal layer, the low-melting-point metal layer is melted to be bonded to the electrode, whereby the low-melting-point metal layer establishes conduction between the electrodes. For example, the low-melting-point metal layer and the electrode are liable to be in surface contact instead of point contact, the connection resistance is reduced. Also, by use of a conductive particle in which at least a conductive outside surface is a low-melting-point metal layer, the bonding strength between the low-melting-point metal layer and the electrode is increased. As a result of this, exfoliation between the low-melting-point metal layer and the electrode is less likely to occur, so that the conduction reliability is effectively increased.

The low-melting-point metal constituting the above low-melting-point metal layer is not particularly limited. The low-melting-point metal is preferably tin or an alloy containing tin. Examples of the alloy include tin-silver alloy, tin-copper alloy, tin-silver-copper alloy, tin-bismuth alloy, tin-zinc alloy, and tin-indium alloy. Among these, the low-melting-point metal is preferably tin, tin-silver alloy, tin-silver-copper alloy, tin-bismuth alloy, or tin-indium alloy because of being excellent in wettability to the electrodes. The low-melting-point metal is more preferably tin-bismuth alloy or tin-indium alloy.

Also, the low-melting-point metal is preferably solder. The material constituting the solder is not particularly limited; however, the material is preferably a filler material having a liquidus of 450° C. or lower based on JIS Z3001: welding terms. The composition of the solder may be, for example, a metal composition containing zinc, gold, lead, copper, tin, bismuth, indium, or the like. Among these, tin-indium-based composition (117° C. eutectoid) or tin-bismuth-based composition (139° C. eutectoid) having a low melting point and being free of lead is preferable. In other words, it is preferred that the solder does not contain lead and is a solder containing tin and indium or a solder containing tin and bismuth.

In order to increase the bonding strength of the low-melting-point metal to the electrodes to a further extent, the low-melting-point metal may contain a metal such as nickel, copper, antimony, aluminum, zinc, iron, gold, titanium, phosphorus, germanium, tellurium, cobalt, bismuth, manganese, chromium, molybdenum, or palladium. From the viewpoint of further increasing the bonding strength of the low-melting-point metal to the electrodes, the low-melting-point metal preferably contains nickel, copper, antimony, aluminum, or zinc. From the viewpoint of furthermore increasing the bonding strength of the low-melting-point metal to the electrodes, the content of these metals for increasing the bonding strength is preferably 0.0001 wt % or more and preferably 1 wt % or less in 100 wt % of the low-melting-point metal.

It is preferred that the conductive particle has a resin particle and a conductive layer disposed on a surface of the resin particle; the outside surface of the conductive layer is a low-melting-point metal layer; and the conductive particle has, separately from the low-melting-point metal layer, a second conductive layer between the resin particle and the low-melting-point metal layer (solder layer or the like). In this case, the low-melting-point metal layer is a part of the whole conductive layer, and the second conductive layer is a part of the whole conductive layer.

The second conductive layer that is separate from the low-melting-point metal layer preferably contains a metal. The metal constituting the second conductive layer is not particularly limited. Examples of the metal include gold, silver, copper, platinum, palladium, zinc, lead, aluminum, cobalt, indium, nickel, chromium, titanium, antimony, bismuth, germanium, cadmium, and alloys of these. Also, as the metal, tin-doped indium oxide (ITO) may be used. One kind of the metal may be used alone, or two or more kinds thereof may be used in combination.

The second conductive layer is preferably a nickel layer, a palladium layer, a copper layer, or a gold layer, more preferably a nickel layer or a gold layer, and still more preferably a copper layer. The conductive particle preferably has a nickel layer, a palladium layer, a copper layer, or a gold layer, more preferably has a nickel layer or a gold layer, and still more preferably has a copper layer. By using the conductive particle having these preferable conductive layers for connection between the electrodes, the connection resistance between the electrodes is further reduced. Also, the low-melting-point metal layer can be formed more easily on the surface of these preferable conductive layers. Here, the second conductive layer may be a low-melting-point metal layer such as a solder layer. The conductive particle may have a plurality of low-melting-point metal layers.

The thickness of the low-melting-point metal layer is preferably 0.1 μm or more, more preferably 0.5 μm or more, still more preferably 1 μm or more, and preferably 50 μm or less, more preferably 10 μm or less, still more preferably 5 μm or less, and particularly preferably 3 μm or less. When the thickness of the low-melting-point metal layer is above or equal to the above lower limit, the electric conductivity is sufficiently increased. When the thickness of the low-melting-point metal layer is below or equal to the above upper limit, the difference of thermal expansivity between the resin particle and the low-melting-point metal layer decreases, so that the exfoliation of the low-melting-point metal layer becomes less likely to occur.

When the conductive layer is a conductive layer other than the low-melting-point metal layer or when the conductive layer has a multilayer structure, the total thickness of the conductive layer is preferably 0.1 μm or more, more preferably 0.5 μm or more, still more preferably 1 μm or more, and preferably 50 μm or less, more preferably 10 μm or less, still more preferably 5 μm or less, and particularly preferably 3 μm or less.

The average particle diameter of the conductive particle is preferably 100 μm or less, more preferably 20 μm or less, still more preferably less than 20 μm, furthermore preferably 15 μm or less, and particularly preferably 10 μm or less. The average particle diameter of the conductive particle is preferably 0.5 μm or more, more preferably 1 μm or more. From the viewpoint of further increasing the connection reliability of the connection structure in the case of receiving thermal hysteresis, the average particle diameter of the conductive particle is particularly preferably 1 μm or more and 10 μm or less, and most preferably 1 μm or more and 4 μm or less. It is also preferred that average particle diameter of the conductive particle is 3 μm or less.

The average particle diameter of the conductive particle is particularly preferably 1 μm or more and 100 μm or less because of being a size suitable for the conductive particle in the conductive material and being capable of further reducing the interval between the electrodes.

The "average particle diameter" in the conductive particle indicates a number-average particle diameter. The average particle diameter of the conductive particle can be determined by observing arbitrary 50 conductive particles with an electron microscope or an optical microscope and calculating an average value.

The surface of the conductive particle may be subjected to an insulation treatment with an insulating material such as an insulating particle or the like. The insulating material or the like is preferably removed from the connection part by being softened and fluidized with heat at the time of connection. This allows that the short circuiting between the electrodes can be suppressed.

The content of the conductive particle is not particularly limited. In 100 wt % of the curable composition, the content of the conductive particle is preferably 0.1 wt % or more, more preferably 0.5 wt % or more, preferably 40 wt % or less, more preferably 20 wt % or less, and still more preferably 15 wt % or less. When the content of the conductive particle is above or equal to the above lower limit and below or equal to the above upper limit, the conductive particle can be easily disposed between the upper and lower electrodes that are to be connected. Further, it becomes less likely that adjacent electrodes that must not be connected are electrically connected via a plurality of conductive particles. In other words, short circuiting between adjacent electrodes can be prevented.

(Use of Curable Composition for Electronic Component)

The above curable composition can be used for bonding various connection object members. The curable composition may be a paste or a film. The curable composition is preferably a paste.

When the curable composition is a conductive material containing a conductive particle, the conductive material can be used as a conductive paste, a conductive film, or the like. When conductive material is used as a conductive film, a film that does not contain a conductive particle may be laminated on the conductive film that contains a conductive particle. Here, the films include sheets. The curable composition is preferably a conductive paste in a paste form. The conductive paste is preferably an anisotropic conductive paste. The conductive film is preferably an anisotropic conductive film.

The above curable composition can be used for bonding various connection object members. The curable composition is suitably used for obtaining a connection structure that is provided with a first connection object member, a second connection object member, and a connection part that connects between the first connection object member and the second connection object member. The above connection part is formed by curing the above curable composition.

It is preferable to obtain a connection structure in which the curable composition for an electronic component contains a conductive particle; the first connection object member has a first electrode on a surface thereof; the second connection object member has a second electrode on a surface thereof; and the first electrode and the second electrode are electrically connected by the conductive particle.

FIG. 1 schematically shows one example of a connection structure using a curable composition according to one embodiment of the present invention in a cross-sectional view.

A connection structure 1 shown in FIG. 1 is provided with a first connection object member 2, a second connection object member 4, and a connection part 3 that connects between the first connection object member 2 and the second connection object member 4. The connection part 3 is a cured product layer and is formed by curing a curable composition (conductive material) for an electronic component that contains a conductive particle 5.

The first connection object member 2 has a plurality of first electrodes 2a on a surface (upper surface) thereof. The second connection object member 4 has a plurality of second electrodes 4a on a surface (lower surface) thereof. The first electrodes 2a and the second electrodes 4a are electrically connected by one or a plurality of conductive particles 5. Therefore, the first and second connection object members 2, 4 are electrically connected by the conductive particle 5.

The connection between the first and second electrodes 2a, 4a is established typically by superposing the first connection object member 2 and the second connection object member 4 via the curable composition so that the first and second electrodes 2a, 4a may oppose each other and thereafter pressing in curing the curable composition. By pressing, the conductive particle 5 is generally compressed.

The above first and second connection object members are not particularly limited. Specific examples of the first and second connection object members include electronic components such as a semiconductor chip, a capacitor, and a diode, electronic components such as circuit boards such as a printed board, a flexible printed circuit board, a glass epoxy substrate, and a glass substrate, and others.

Here, the above curable composition may not contain a conductive particle. In this case, the above curable composition is used for bonding and connecting the first and second connection object members without electrically connecting the first and second connection object members.

When the curable composition is a conductive material, the conductive material can be used, for example, for connecting between a flexible printed circuit board and a glass substrate (FOG (Film on Glass)), connecting between a semiconductor chip and a flexible printed circuit board (COF (Chip on Film)), connecting between a semiconductor chip and a glass substrate (COG (Chip on Glass)), connecting between a flexible printed circuit board and a glass epoxy substrate (FOB (Film on Board)), or the like. Among these, the above conductive material is suitable for use in FOG or use in COG, and is more suitable for use in COG. The curable composition is preferably a conductive material used for connecting between a flexible printed circuit board and a glass substrate or connecting between a semiconductor chip and a flexible printed circuit board, and is more preferably a conductive material used for connecting between a semiconductor chip and a flexible printed circuit board.

Hereafter, the present invention will be specifically described by raising Examples and Comparative Examples. The present invention is not limited to the following Examples alone.

The following blending components were prepared.

(Epoxy Compound)

Epoxy compound 1 (epoxy group containing polymer, "MARPROOF G-01100" manufactured by NOF Corporation)

Epoxy compound 2 (resorcinol type epoxy compound, "EX-201" manufactured by Nagase Chemtex Corporation)

Epoxy compound 3 (triazine triglycidyl ether, "TEPIC-SS" manufactured by NISSAN CHEMICAL INDUSTRIES, LTD.)

(Anionic Curing Agent)

Anionic curing agent 1 (imidazole compound microcapsule, "Novacure HX3921HP" manufactured by Asahi Kasei E-materials Co., Ltd.)

Anionic curing agent 2 (imidazole compound, "2E4MZ" manufactured by Shikoku Chemicals Corporation)

(Photocurable Compound)

Radical-polymerizable compound (Ethoxylated bisphenol A-dimethacrylate, "BLEMMER DE-450" manufactured by NOF Corporation)

(Photocuring Agent)

Radical initiator ("Irgacure 1122" manufactured by BASFCHIBA Co., Ltd.)

(Flux)

Flux 1 ("glutaric acid" manufactured by Wako Pure Chemical Industries, Ltd.)

Flux 2 ("adipic acid" manufactured by Wako Pure Chemical Industries, Ltd.)

(Basic Compound)

Basic compound 1 ("benzylamine" manufactured by Wako Pure Chemical Industries, Ltd.)

Basic compound 2 ("2-methylbenzylamine" manufactured by Wako Pure Chemical Industries, Ltd.)

Basic compound 3 ("N-methylbenzylamine" manufactured by Wako Pure Chemical Industries, Ltd.)

(Conductive Particle)

Conductive particle 1: SnBi solder particle ("Sn58Bi-20" manufactured by Fukuda Metal Co., Ltd., having an average particle diameter of 4.5 μm)

Conductive particle 2: resin core solder covered particle, fabricated according to the following procedure)

Divinylbenzene resin particle ("Micropearl SP-207" manufactured by Sekisui Chemical Company, Limited, having an average particle diameter of 7 μm, a softening point of 330° C., a 10% K value (23° C.) of 4 GPa) was subjected to nonelectrolytic nickel plating, so as to form an underlying nickel plated layer having a thickness of 0.1 μm on a surface of the resin particle. Subsequently, the resin particle in which the underlying nickel plated layer had been formed was subjected to electrolytic copper plating, so as to form a copper layer having a thickness of 1 μm. Further, electrolytic plating was carried out using an electrolytic plating liquid containing tin and bismuth, so as to form a solder layer having a thickness of 1 μm. In this manner, a conductive particle (having an average particle diameter of 14 μm, CV value of 22%, resin core solder covered particle) was fabricated in which a copper layer having a thickness of 1 μm had been formed on a surface of the resin particle, and a solder layer (tin:bismuth=43 wt %:57 wt %) having a thickness of 1 μm had been formed on a surface of the copper layer.

Conductive particle 3: Au plated particle of divinylbenzene resin particle ("Au-210" manufactured by Sekisui Chemical Company, Limited, having an average particle diameter of 10 μm)

(Other Components)

Filler (nanosilica, "MT-10" manufactured by Tokuyama Corporation)

Adhesion imparting agent ("KBE-403" manufactured by Shin-Etsu Chemical Co., Ltd.)

Examples 1 to 19 and Comparative Examples 1, 2

An anisotropic conductive paste was obtained by blending the components shown in the following Tables 1 to 3 in a blending amount shown in the following Tables 1 to 3 and stirring at 2000 rpm for 5 minutes with use of a planetary stirrer.

(Evaluation)

Fabrication of a connection structure (FOB) used in the evaluation items of (1) to (3):

Examples 1 to 12, 14 to 19, and Comparative Examples 1, 2

A glass epoxy substrate (FR-4 substrate) having 70 strips of copper electrodes on an upper surface thereof was prepared in an electrode pattern with L/S being 100 μm/100 μm. Also, a flexible printed circuit board having 70 strips of copper electrodes on a lower surface thereof was prepared in an electrode pattern with L/S being 100 μm/100 μm. The patterns of the FR-4 substrate and the flexible printed circuit board were designed so that a daisy chain would be formed by superposing.

The obtained anisotropic conductive paste was applied to a thickness of 200 μm onto the upper surface of the above glass epoxy substrate, so as to form an anisotropic conductive paste layer. Subsequently, UV radiation was carried out for 10 seconds under conditions of 200 mW at a wavelength of 365 nm with use of a LED-UV radiator, so as to turn the anisotropic conductive paste layer into a B-stage. The above flexible printed circuit board was laminated onto the anisotropic conductive paste layer that had been turned into a B-stage so that the electrodes would face each other. Thereafter, a heating press-bonding head was mounted onto an upper surface of the flexible printed circuit board while adjusting the temperature of the press-bonding head for applying pressure so that the temperature of the anisotropic conductive paste layer would be 170° C. (present press-bonding temperature). While applying a pressure of 1 MPa, the anisotropic conductive paste layer was cured until the curing was completed at 170° C., so as to obtain a connection structure (FOB).

Example 13

In Example 13, a connection structure (FOB) was obtained according to the same procedure as in Examples 1 to 12, 14 to 19 and Comparative Examples 1, 2 except that UV radiation was not carried out.
(1) Curing Speed The time until the anisotropic conductive paste layer (anisotropic conductive paste layer turned into a B-stage after UV radiation in the case in which UV radiation was carried out) was cured by heating was measured. Specifically, after the anisotropic conductive paste was applied onto the above glass epoxy substrate according to the procedure of obtaining the above connection structure and after UV radiation in the case in which UV radiation was carried out, the gel time until the tack (adhesiveness to such a degree that a ball φ1/16 does not stop at the measurement part in a ball tack tester manufactured by YASUDA SEIKI SEISAKUSHO, LTD. with runway: 100 mm, measurement part: 100 mm, tilt angle of 30°) on the surface of the anisotropic conductive paste layer (anisotropic conductive paste layer turned into a B-stage after UV radiation in the case in which UV radiation was carried out) disappeared was evaluated on a 170° C. hot plate. The curing speed was determined under the following standard.
[Determination Standard of Curing Speed]
○: Gel time until the tack on the surface disappears is less than 3 seconds
x: Gel time until the tack on the surface disappears is 3 seconds or more
(2) Conductivity By using the obtained connection structure, the connection resistance at 20 sites was evaluated by the 4-terminal method. The conductivity was determined under the following standard.
[Determination Standard of Conductivity]
○○: Average value of connection resistance is 8.0 Ω or less
○: Average value of connection resistance exceeds 8.0 Ω and is 10.0 Ω or less
Δ: Average value of connection resistance exceeds 10.0Ω and is 15.0 Ω or less
x: Average value of connection resistance exceeds 15.0 Ω
(3) Heat Shock Resistance For each of the obtained connection structures, 10 pieces thereof were prepared. A process in which the temperature was held at −30° C. for 5 minutes and then, after the temperature was raised up to 80° C. and held for 5 minutes, the temperature was lowered down to −30° C. was set to be one cycle. A cold heat cycle test of one hour per one cycle was carried out. After 500 cycles, the ten connection structures for each were taken out.

For the ten connection structures after the cold heat cycle test of 500 cycles, the number of pieces in which poor conduction between the upper and lower electrodes occurred was counted. The heat shock resistance was determined according to the following standard.
[Determination Standard of Heat Shock Resistance]
○○: The ratio of rise in the connection resistance from the connection resistance before the cold heat cycle test is 5% or less in all of the ten pieces of connection structures
○: The ratio of rise in the connection resistance from the connection resistance before the cold heat cycle test exceeds 5% and is 10% or less in all of the ten pieces of connection structures
x: Among the ten pieces of connection structures, there is one or more connection structures in which the ratio of rise in the connection resistance from the connection resistance before the cold heat cycle test exceeds 10%
(4) Moist Heat Resistance The moist heat resistance was evaluated by a bias test. Specifically, a glass epoxy substrate (FR-4 substrate) having 70 strips of comb-shaped copper electrode patterns with L/S being 100 μm/100 μm on an upper surface thereof was prepared. Also, a flexible printed circuit board having 70 strips of comb-shaped copper electrode patterns with L/S being 100 μm/100 μm on a lower surface thereof was prepared. A connection structure was obtained by the same method as the method of fabricating the connection structure used in the evaluation items of (1) to (3). The patterns of the FR-4 substrate and the flexible printed circuit board were designed so that a comb-shaped pattern would be formed by superposing. The moist heat resistance was determined according to the following standard.
[Determination Standard of Moist Heat Resistance]
○○: Resistance value is $10^8 \Omega$ or more
○: Resistance value is $10^7 \Omega$ or more and less than $10^8 \Omega$
x: Resistance value is less than $10^7 \Omega$
(5) Storage Stability The anisotropic conductive paste was left to stand quietly at 23° C. for 48 hours, and change in the viscosity before and after being left to stand quietly was measured using an E-type viscometer TV-33 (manufactured by Toki Sangyo Co., Ltd.). The storage stability was determined under the following standard from the change in the viscosity before and after being left to stand quietly.
[Determination Standard of Storage Stability]
○○: Viscosity after being left to stand quietly for 48 hours/initial viscosity is less than 1.2
○: Viscosity after being left to stand quietly for 48 hours/initial viscosity is 1.2 or more and less than 1.5
x: Viscosity after being left to stand quietly for 48 hours/initial viscosity is 1.5 or more
(6) Storage Stability The anisotropic conductive paste was left to stand quietly at 40° C. for 48 hours, and change in the viscosity before and after being left to stand quietly was measured using an E-type viscometer TV-33 (manufactured by Toki Sangyo Co., Ltd.). The storage stability was determined under the following standard from the change in the viscosity before and after being left to stand quietly.
[Determination Standard of Storage Stability]
○○: Viscosity after being left to stand quietly for 48 hours/initial viscosity is less than 1.2
○: Viscosity after being left to stand quietly for 48 hours/initial viscosity is 1.2 or more and less than 1.35
Δ: Viscosity after being left to stand quietly for 48 hours/initial viscosity is 1.35 or more and less than 1.5
x: Viscosity after being left to stand quietly for 48 hours/initial viscosity is 1.5 or more The results are shown in the following Tables 1 to 3.

TABLE 1

|  |  | Ex. 1 | Ex. 2 | Ex. 3 | Ex. 4 | Ex. 5 | Ex. 6 | Ex. 7 | Ex. 8 |
|---|---|---|---|---|---|---|---|---|---|
| Blending components (parts by weight) | Epoxy compound 1 | 15 |  | 15 | 15 | 15 | 15 | 15 | 15 |
|  | Epoxy compound 2 | 25 | 50 |  | 25 | 25 | 25 | 25 | 25 |
|  | Epoxy compound 3 |  |  | 25 |  |  |  |  |  |
|  | Anionic curing agent 1 | 14 | 14 | 14 |  | 14 | 14 | 14 | 14 |
|  | Anionic curing agent 2 |  |  |  | 3 |  |  |  |  |
|  | Radical-polymerizable compound | 10 |  | 10 | 10 | 10 | 10 | 10 | 10 |
|  | Radical initiator | 0.3 | 0.3 | 0.3 | 0.3 | 0.3 | 0.3 | 0.3 | 0.3 |
|  | Flux 1 | 2 | 2 | 2 | 2 |  | 2 | 2 | 2 |
|  | Flux 2 |  |  |  |  | 2 |  |  |  |
|  | Basic compound 1 | 1.2 | 1.2 | 1.2 | 1.2 | 1.2 |  | 1.2 | 1.2 |
|  | Basic compound 2 |  |  |  |  |  | 1.2 |  |  |
|  | Basic compound 3 |  |  |  |  |  |  |  |  |
|  | Conductive particle 1 | 30 | 30 | 30 | 30 | 30 | 30 |  |  |
|  | Conductive particle 2 |  |  |  |  |  |  | 20 |  |
|  | Conductive particle 3 |  |  |  |  |  |  |  | 10 |
|  | Filler | 1.5 | 1.5 | 1.5 | 1.5 | 1.5 | 1.5 | 1.5 | 1.5 |
|  | Adhesion imparting agent | 1 | 1 | 1 | 1 | 1 | 1 | 1 | 1 |
| Evaluation | (1) Curing speed | ○ | ○ | ○ | ○ | ○ | ○ | ○ | ○ |
|  | (2) Conductivity | ○○ | ○○ | ○○ | ○○ | ○○ | ○○ | ○○ | ○○ |
|  | (3) Heat shock resistance | ○○ | ○ | ○○ | ○○ | ○○ | ○○ | ○○ | ○○ |
|  | (4) Moist heat resistance | ○ | ○ | ○○ | ○ | ○ | ○ | ○ | ○ |
|  | (5) Storage stability (23° C., 48 hours) | ○ | ○ | ○ | ○ | ○ | ○ | ○ | ○ |
|  | (6) Storage stability (40° C., 48 hours) | ○ | ○ | ○ | ○ | ○ | ○ | ○ | Δ |

TABLE 2

|  |  | Ex. 9 | Ex. 10 | Ex. 11 | Ex. 12 | Ex. 13 | Comp. Ex. 1 | Comp. Ex. 2 |
|---|---|---|---|---|---|---|---|---|
| Blending components (parts by weight) | Epoxy compound 1 | 15 | 15 | 15 | 15 | 25 | 15 | 15 |
|  | Epoxy compound 2 | 25 | 25 | 25 | 25 | 25 | 25 | 25 |
|  | Epoxy compound 3 |  |  |  |  |  |  |  |
|  | Anionic curing agent 1 | 14 | 14 | 14 | 14 | 14 | 14 | 14 |
|  | Anionic curing agent 2 |  |  |  |  |  |  |  |
|  | Radical-polymerizable compound | 10 | 10 | 10 | 10 |  | 10 | 10 |
|  | Radical initiator | 0.3 | 0.3 | 0.3 | 0.3 |  | 0.3 | 0.3 |
|  | Flux 1 | 5 | 0.25 | 2 | 2 | 2 | 2 |  |
|  | Flux 2 |  |  |  |  |  |  |  |
|  | Basic compound 1 | 1.2 | 1.2 | 4.8 | 0.3 | 1.2 |  |  |
|  | Basic compound 2 |  |  |  |  |  |  |  |
|  | Basic compound 3 |  |  |  |  |  |  |  |
|  | Conductive particle 1 | 30 | 30 | 30 | 30 | 30 | 30 | 30 |
|  | Conductive particle 2 |  |  |  |  |  |  |  |
|  | Conductive particle 3 |  |  |  |  |  |  |  |
|  | Filler | 1.5 | 1.5 | 1.5 | 1.5 | 1.5 | 1.5 | 1.5 |
|  | Adhesion imparting agent | 1 | 1 | 1 | 1 | 1 | 1 | 1 |
| Evaluation | (1) Curing speed | ○ | ○ | ○ | ○ | ○ | x | ○ |
|  | (2) Conductivity | ○○ | ○ | ○○ | ○○ | ○ | ○○ | x |
|  | (3) Heat shock resistance | ○○ | ○○ | ○○ | ○○ | ○ | ○○ | ○○ |
|  | (4) Moist heat resistance | ○ | ○ | ○ | ○ | ○ | x | ○ |
|  | (5) Storage stability (23° C., 48 hours) | ○ | ○○ | ○ | ○ | ○ | x | ○○ |
|  | (6) Storage stability (40° C., 48 hours) | ○ | ○○ | ○ | ○ | ○ | x | ○○ |

TABLE 3

|  |  | Ex. 14 | Ex. 15 | Ex. 16 | Ex. 17 | Ex. 18 | Ex. 19 |
|---|---|---|---|---|---|---|---|
| Blending components (parts by weight) | Epoxy compound 1 | 15 |  | 15 | 15 | 15 | 15 |
|  | Epoxy compound 2 | 25 | 50 |  | 25 | 25 | 25 |
|  | Epoxy compound 3 |  |  | 25 |  |  |  |
|  | Anionic curing agent 1 | 14 | 14 | 14 |  | 14 | 14 |
|  | Anionic curing agent 2 |  |  |  | 3 |  |  |
|  | Radical-polymerizable compound | 10 |  | 10 | 10 | 10 | 10 |
|  | Radical initiator | 0.3 | 0.3 | 0.3 | 0.3 | 0.3 | 0.3 |
|  | Flux 1 | 2 | 2 | 2 | 2 |  | 2 |
|  | Flux 2 |  |  |  |  | 2 |  |
|  | Basic compound 1 |  |  |  |  |  |  |
|  | Basic compound 2 |  |  |  |  |  |  |
|  | Basic compound 3 | 1.2 | 1.2 | 1.2 | 1.2 | 1.2 | 1.2 |

TABLE 3-continued

|  |  | Ex. 14 | Ex. 15 | Ex. 16 | Ex. 17 | Ex. 18 | Ex. 19 |
|---|---|---|---|---|---|---|---|
|  | Conductive particle 1 | 30 | 30 | 30 | 30 | 30 |  |
|  | Conductive particle 2 |  |  |  |  |  | 20 |
|  | Conductive particle 3 |  |  |  |  |  |  |
|  | Filler | 1.5 | 1.5 | 1.5 | 1.5 | 1.5 | 1.5 |
|  | Adhesion imparting agent | 1 | 1 | 1 | 1 | 1 | 1 |
| Evaluation | (1) Curing speed | ○ | ○ | ○ | ○ | ○ | ○ |
|  | (2) Conductivity | ○○ | ○○ | ○○ | ○○ | ○○ | ○○ |
|  | (3) Heat shock resistance | ○○ | ○ | ○○ | ○○ | ○○ | ○○ |
|  | (4) Moist heat resistance | ○ | ○ | ○○ | ○ | ○ | ○ |
|  | (5) Storage stability (23° C., 48 hours) | ○ | ○ | ○ | ○ | ○ | ○ |
|  | (6) Storage stability (40° C., 48 hours) | Δ | Δ | Δ | Δ | Δ | Δ |

In Example 8, the storage stability at a comparatively high temperature (40° C.) was a little low because the conductive outside surface of the conductive particle was not solder. In Examples 14 to 19, the storage stability at a comparatively high temperature (40° C.) was a little low because secondary amine was used as a basic compound.

EXPLANATION OF SYMBOLS

1 . . . connection structure
2 . . . first connection object member
2a . . . first electrode
3 . . . connection part
4 . . . second connection object member
4a . . . second electrode
5 . . . conductive particle
11 . . . conductive particle
11a . . . surface
12 . . . resin particle
12a . . . surface
13 . . . conductive layer
14 . . . first conductive layer
14a . . . surface
15 . . . solder layer
15a . . . molten solder layer part
21 . . . conductive particle
22 . . . solder layer
31 . . . solder particle

The invention claimed is:

1. A curable composition for an electronic component, containing an epoxy compound, an anionic curing agent, a flux, a basic compound that is not an anionic curing agent in the curable composition for an electronic component, and a conductive particle,
the basic compound being a primary amine having an aromatic skeleton,
the content of the basic compound being 0.1 parts by weight or more and 10 parts by weight or less relative to 100 parts by weight of the epoxy compound.

2. The curable composition for an electronic component according to claim 1,
wherein the content of the basic compound is 0.1 parts by weight or more and 5 parts by weight or less relative to 100 parts by weight of the epoxy compound.

3. The curable composition for an electronic component according to claim 1,
wherein the content of the flux is 0.5 parts by weight or more and 15 parts by weight or less relative to 100 parts by weight of the epoxy compound.

4. The curable composition for an electronic component according to claim 1,
wherein the basic compound is benzylamine.

5. The curable composition for an electronic component according to claim 1,
wherein the anionic curing agent is an imidazole compound.

6. The curable composition for an electronic component according to claim 1,
wherein the conductive particle is a conductive particle whose conductive outside surface is a solder.

7. A connection structure comprising:
a first connection object member;
a second connection object member; and
a connection part that connects between the first connection object member and the second connection object member,
wherein the connection part is formed by curing a curable composition for an electronic component according to claim 1.

8. The connection structure according to claim 7, wherein the curable composition for an electronic component contains a conductive particle,
the first connection object member has a first electrode on a surface thereof,
the second connection object member has a second electrode on a surface thereof, and
the first electrode and the second electrode are electrically connected by the conductive particle.

* * * * *